(12) United States Patent
Ueda

(10) Patent No.: US 7,651,954 B2
(45) Date of Patent: Jan. 26, 2010

(54) MANUFACTURING METHOD OF SEMICONDUCTOR DEVICE AND SEMICONDUCTOR DEVICE MANUFACTURING APPARATUS

(75) Inventor: Tatsushi Ueda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 90 days.

(21) Appl. No.: 11/896,231

(22) Filed: Aug. 30, 2007

(65) Prior Publication Data

US 2008/0124941 A1    May 29, 2008

(30) Foreign Application Priority Data

Sep. 6, 2006    (JP)    ............................ 2006-242103

(51) Int. Cl.
*H01L 21/31*    (2006.01)

(52) U.S. Cl. ..................................................... 438/763
(58) Field of Classification Search ....................... None
See application file for complete search history.

(56) References Cited

U.S. PATENT DOCUMENTS

2005/0277302 A1* 12/2005 Nguyen et al. .............. 438/763

FOREIGN PATENT DOCUMENTS

| JP | A-08-078699 | 3/1996 |
| KR | 2002-0009071 | 2/2002 |

* cited by examiner

*Primary Examiner*—Charles D Garber
*Assistant Examiner*—André C Stevenson
(74) *Attorney, Agent, or Firm*—Oliff & Berridge, PLC

(57) ABSTRACT

To provide a manufacturing method of a semiconductor device for forming a diffusion layer by diffusing phosphorus atoms on a surface of a silicon substrate on which resist is applied, including the step of forming a diffusion layer, with a temperature of the silicon substrate maintained lower than a deterioration temperature of the resist.

7 Claims, 5 Drawing Sheets

MANUFACTURING METHOD OF SEMICONDUCTOR DEVICE AND SEMICONDUCTOR DEVICE MANUFACTURING APPARATUS

BACKGROUND

1. Technical Field

The present invention relates to a manufacturing method of a semiconductor device and a semiconductor device manufacturing apparatus for forming a diffusion layer by diffusing phosphorus atoms on a surface of a silicon substrate.

2. Background Art

As an example of a semiconductor device, a planar type FET (Field Effect Transistor) is manufactured, so that source, drain, and channel are formed directly on a flat silicon substrate for example, and a flat gate and a gate electrode are formed on the channel. Then, in a case of a FET device called NMOS, phosphorus atoms, for example, are diffused on the aforementioned channel as impurities for making a current easy to flow.

As a diffusion method of the phosphorus atoms, conventionally, an ion injection method is used wherein the phosphorous atoms are ionized to generate ion beam, which is then injected into a silicon substrate. The ion injection method has an advantage that an injection amount of ions can be controlled by a current amount of the ion beam and a depth of ion injection can be controlled by acceleration energy (acceleration voltage) of the ion beam.

However, when a size of a semiconductor device is reduced along with a high integration, the source, drain, and channel also tend to become thinner. At this time, adjustment is required, to achieve extremely shallow ion injection. However, in a conventional technique of the ion injection, the ion beam accelerated once needs to be decelerated again, and this is disadvantageous in terms of cost and throughput.

In addition, when a three-dimensional construction of a device structure is progressed along with the high integration of the semiconductor device, for example, the channel also needs to be three-dimensionally constructed. When the channel is three-dimensionally constructed, the ions must be injected not only from a vertical direction but also from a lateral direction. However, the ion injection method has strong anisotropy and is disadvantageous for injecting ions uniform both vertically and laterally.

Therefore, instead of the conventional ion injection method, a diffusion method of phosphorus atoms by using plasma has been performed. The diffusion method of phosphorus atoms by using plasma is advantageous, because the phosphorus atoms can be diffused shallow and uniform both vertically and laterally.

SUMMARY OF THE INVENTION

However, the phosphorus atoms are volatile and therefore when the phosphorus atoms are diffused shallow, the following phenomenon easily takes place. Namely, the phosphorus atoms are desorbed with lapse of time after diffusion or the phosphorus atoms are desorbed simultaneously with annealing the silicon substrate.

Therefore, an object of the present invention is to provide a manufacturing method of a semiconductor device and a semiconductor device manufacturing apparatus capable of preventing diffused phosphorus atoms from being desorbed from a silicon substrate.

According to one of the aspects of the present invention, there is provided the manufacturing method of the semiconductor device for forming a diffusion layer by diffusing the phosphorus atoms on the surface of the silicon substrate on which resist is applied, including a diffusion layer forming step of forming the diffusion layer, with a temperature of the silicon substrate maintained lower than a deterioration temperature of the resist.

In addition, according to another aspect of the present invention, there is provided a semiconductor device manufacturing apparatus, including:

a processing chamber that houses the silicon substrate, with resist applied on its surface;

a heating unit that heats the surface of the silicon substrate housed in the processing chamber;

a gas supply line that supplies gas to the inside the processing chamber;

a plasma generation unit that generates plasma to excite the gas supplied from the gas supply line; and a controller that controls the heating unit, the gas supply line, and the plasma generation unit, wherein under the control of the controller, phosphorus atom content gas is supplied to the inside of the processing chamber through the gas supply line, plasma is generated in the processing chamber by the plasma generation unit, and plasma-excited phosphorus atom content gas is supplied to the surface of the silicon substrate, to form the diffusion layer of the phosphorus atoms, with the temperature of the silicon substrate maintained lower than the deterioration temperature of the resist by the heating unit.

According to the present invention, it is possible to provide the manufacturing method of the semiconductor device and the semiconductor device manufacturing apparatus capable of preventing desorption of the diffused phosphorus atoms from the silicon substrate.

DETAILED DESCRIPTION OF PREFERRED EMBODIMENTS OF THE INVENTION

In order to solve the above-described problem, after strenuous study, the inventors of the present invention consequently achieves a point that after a diffusion layer is formed, with phosphorus atoms diffused on a silicon substrate, an oxide film is formed on the surface of this diffusion layer, thereby making it possible to prevent a desorption of the phosphorus atoms from the silicon substrate.

Also, the inventors of the present invention achieves a point that when the diffusion layer of the phosphorus atoms is formed on the surface of the silicon substrate, with the resist applied thereon, it is effective to maintain a temperature of the silicon substrate low. This is because when the temperature of the silicon substrate is set high for diffusing the phosphorus atoms, deterioration of the resist such as hardening of the resist occurs in some cases. Also, the hardened resist is hardly peeled off from the silicon substrate, thus adversely affecting the processing step that follows thereafter in some cases.

Further, the inventors of the present invention achieve a point that in forming the oxide film on the surface of the formed diffusion layer, it is effective to form the oxide film by using plasma. This is because when the oxide film is formed through thermal oxidation, deterioration of the resist occurs as described above, thus adversely affecting the processing step that follows thereafter in some cases.

Based on the above-described knowledge, the inventors of the present invention achieve the invention of the manufacturing method of the semiconductor device capable of preventing the desorption of the diffused phosphorus atoms from the silicon substrate. The manufacturing method of the semiconductor device according to an embodiment of the present invention will be explained hereunder.

(1) Structure of the Semiconductor Device Manufacturing Apparatus

Figure 1:
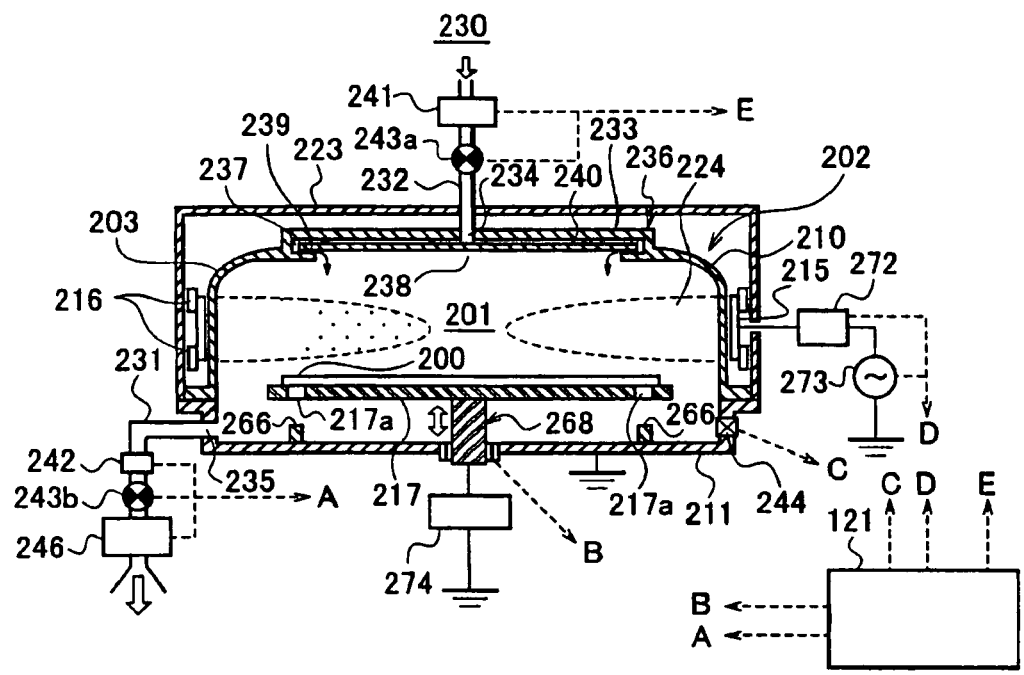
FIG. 1 is a sectional block diagram of an MMT device as a semiconductor device according to an embodiment of the present invention.

First, prior to an explanation for the manufacturing method of the semiconductor device according to an embodiment of the present invention, the structure of the semiconductor device, whereby such a method is executed, is explained using FIG. 1. FIG. 1 is a sectional block diagram of an MMT apparatus as the semiconductor device manufacturing apparatus whereby the embodiment of the present invention is executed.

The MMT apparatus is an apparatus for plasma-processing a silicon substrate 200 such as a silicon wafer, by using a modified magnetron type plasma source for generating high-density plasma by an electric field and a magnetic field.

The MMT apparatus includes a processing furnace 202 for plasma-processing the silicon substrate 200. Further, the processing furnace 202 includes a processing vessel 203 constituting a processing chamber 201, a susceptor 217, a gate valve 244, a shower head 236, a gas exhaust port 235, a plasma generation unit (a cylindrical electrode 215, an upper magnet 216a, and a lower magnet 216b), and a controller 121. Thus, the silicon substrate 200 can be plasma-processed in the processing chamber 201.

(1-1) Processing Vessel

As shown in FIG. 1, the processing vessel 203 provided in the processing furnace 202 includes a dome-shaped upper side vessel 210, being a first vessel, and a U-shaped lower side vessel 211, being a second vessel. Then, by covering an upper part of the lower side vessel 211 with the upper side vessel 210, the processing chamber 201 is formed. Note that the upper side vessel 210 is formed of a non-metallic material such as aluminum oxide or quartz, and the lower side vessel 211 is formed of aluminum.

(1-2) Susceptor

A susceptor 217 as a substrate holding unit for holding the silicon substrate 200 is disposed in a central part on the bottom side of the processing chamber 201. The susceptor 217 is formed of the non-metal material such as aluminum nitride, ceramics, or quartz, so as to reduce a metal contamination of a film formed on the silicon substrate 200.

A heater (not shown) as a heating unit is integrally embedded in the susceptor 217, so that the silicon substrate 200 can be heated. When power is supplied to the heater, the silicon substrate 200 can be heated up to about 500° C.

The susceptor 217 is electrically insulated from the lower side vessel 211. In addition, a second electrode (not shown) as an electrode for changing impedance is provided in the inside of the susceptor 217. The second electrode is grounded through an impedance variable unit 274. The impedance variable unit 274 is constituted of a coil or a variable capacitor, and by controlling the number of patterns of the coil or capacitance of the variable capacitor, a potential of the silicon substrate 200 can be controlled through the second electrode (not shown) and the susceptor 217.

A susceptor elevating/lowering unit 268 for elevating and lowering the susceptor 217 is provided in the susceptor 217. In addition, a through hole 217a is provided in the susceptor 217. Meanwhile, wafer push-up pins 266 for pushing-up (supporting) the silicon substrate 200 are provided in at least three places on the bottom surface of the aforementioned lower side vessel 211. Then, the through hole 217a and the wafer push-up pins 266 are respectively disposed, so that the wafer push-up pins 266 penetrate from the through hole 217a in non-contact with the susceptor 217, when the susceptor 217 is lowered by the susceptor elevating/lowering unit 268.

(1-3) Gate Valve

A gate valve 244, being a partition valve, is provided on the side wall of the lower side vessel 211. The gate valve 244 is adapted to be opened, for carrying the silicon substrate 200 into the processing chamber 201 or carrying out the silicon substrate 200 to the outside of the processing chamber 201 by using a transportation unit (not shown). Also, the gate valve 244 is adapted to be closed, for air-tightly closing the inside of the processing chamber 201.

(1-4) Shower Head

The shower head 236 for supplying gas to the inside of the processing chamber 201 is provided in an upper inside of the processing chamber 201. The shower head 236 includes a cap-like lid member 233, a gas introduction inlet 234, a buffer chamber 237, an opening 238, a shielding plate 240, and a gas discharge outlet 239.

A gas supplying pipe 232 for supplying the gas to the inside of the buffer chamber 237 is connected to the gas introduction inlet 234. The buffer chamber 237 functions as a dispersion space for dispersing reactive gas 230 introduced from the gas introduction inlet 234.

In addition, the gas supplying pipe 232 is connected to a gas cylinder (not shown) of $PH_3$ content gas and a gas cylinder (not shown) of $O_2$ gas, respectively through a valve 243a, being an opening/closing valve, and a mass flow controller 241, being a flow rate controller. Note that the gas cylinder of $PH_3$ content gas and the gas cylinder of $O_2$ gas include a valve, being an opening/closing valve, respectively, and this valve is adapted to open and close so that the $PH_3$ content gas or $O_2$ gas can be supplied to the inside of the gas supplying pipe 232.

(1-5) Evacuating Port

A gas exhaust port 235 for exhausting the gas from the inside of the processing chamber 201 is provided on the side wall of the lower side vessel 211. Further, a gas exhaust pipe 231 for exhausting the gas is connected to the gas exhaust port 235. The gas exhaust pipe 231 is connected to a vacuum pump 246, being an exhaust device, via an APC 242, being a pressure adjusting unit, and the valve 243b, being the opening/closing valve.

(1-6) Plasma Generating Unit

The cylindrical electrode 215 as the first electrode is provided in an outer periphery of the processing vessel 203 (upper side vessel 210) so as to surround a plasma generation area 224 in the processing chamber 201. The cylindrical electrode 215 is formed into a cylinder shape, namely, is cylindrically formed. A high frequency power supply 273 for applying high frequency power is connected to the cylindrical electrode 215, via a matching unit 272 for performing impedance matching. The cylindrical electrode 215 functions as a discharging unit for plasma-exciting the $PH_3$ content gas or the $O_2$ gas supplied to the inside of the processing chamber 201.

In addition, the upper magnet 216a and the lower magnet 216b are respectively attached to upper and lower end portions of an outside surface of the cylindrical electrode 215. The upper magnet 216a and the lower magnet 216b are constituted of a permanent magnet formed in a cylinder shape or a ring shape, respectively.

The upper magnet 216a and the lower magnet 216b have magnetic poles on both ends along a radius direction of the processing chamber 201 (namely, an inner peripheral end and an outer peripheral end). Then, directions of the magnetic poles of the upper magnet 216a and the lower magnet 216b are arranged so as to be opposite to each other. Specifically, the magnetic poles of inner peripheral parts of the upper magnet 216a and the lower magnet 216b are set as different poles. Thus, a magnetic line in a cylinder axis direction is formed along an inside surface of the cylindrical electrode 215.

After the $PH_3$ content gas or the $O_2$ gas is introduced to the inside of the processing chamber, high frequency power is supplied to the cylindrical electrode 215 to form the electric field in the processing chamber 201, and a magnetic field is formed in the processing chamber 201 by using the upper magnet 216a and the lower magnet 216b, thereby generating magnetron plasma discharge in the processing chamber 201. At this time, when released electrons are moved to circulate by the aforementioned electromagnetic field, a plasma ionization ratio is increased, thus making it possible to generate long-lived high density plasma.

Note that a shielding plate 223 is provided around the cylindrical electrode 215, the upper magnet 216a, and the lower magnet 216b, for effectively shielding the electromagnetic field, so that the electromagnetic field formed by the above cylindrical electrode 215, the upper magnet 216a, and the lower magnet 216b does not adversely affect an external environment or other device such as a processing furnace.

(1-7) Controller

Further, the controller 121 as a control unit is constituted to control the APC 242, the valve 243b, and the vacuum pump 246 through a signal line A, control the susceptor elevating/lowering unit 268 through a signal line B, control the gate valve 244 through a signal line C, control the matching unit 272 and the high frequency power supply 273 through a signal line D, control the mass flow controller 241 and the valve 243a through a signal line E, and control the heater embedded in the susceptor and the impedance variable unit 274 through a signal line not shown, respectively.

(2) Manufacturing Method of the Semiconductor Device

Figure 2:
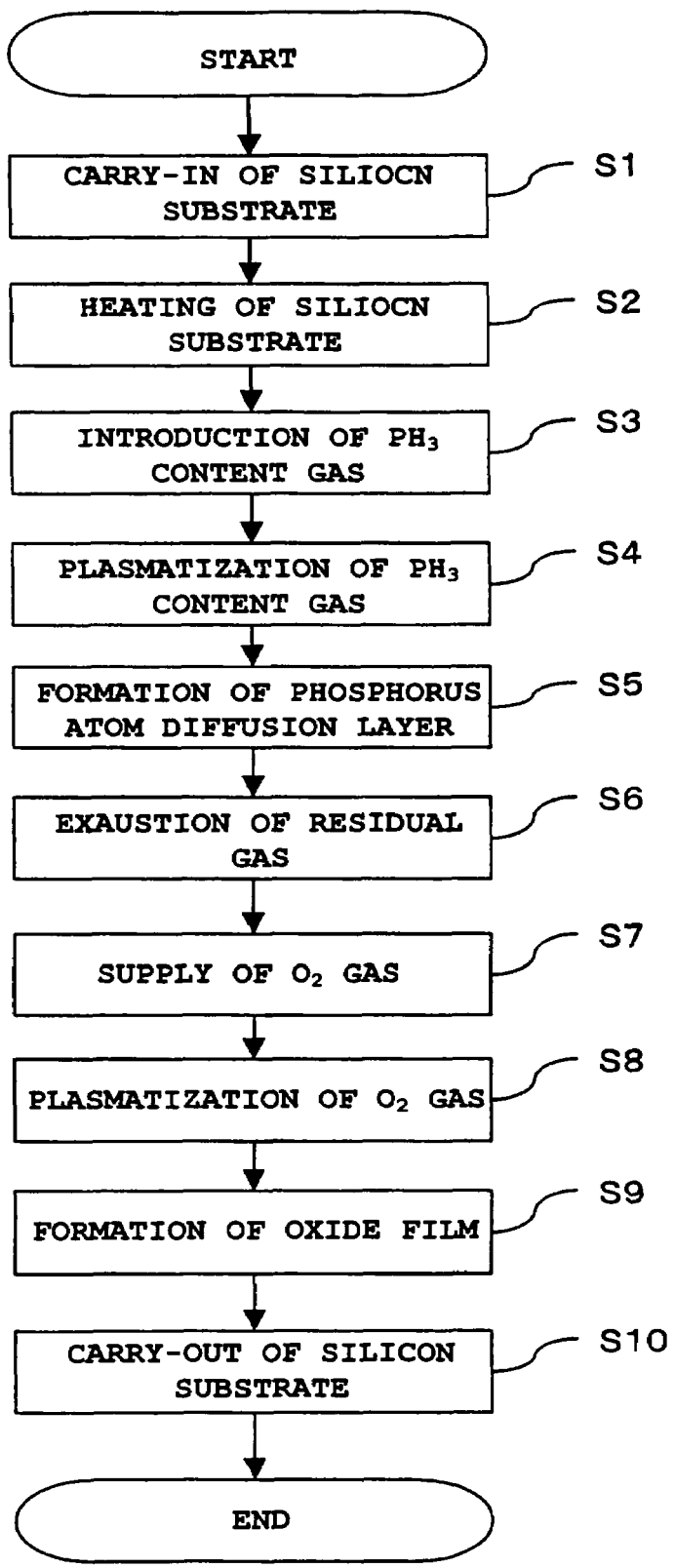
FIG. 2 is a process diagram of a manufacturing method of the semiconductor device according to an embodiment of the present invention.

Subsequently, the manufacturing method of the semiconductor device according to an embodiment of the present invention executed by the aforementioned MMT apparatus will be explained by using FIG. 1 and FIG. 2. Note that FIG. 2 is a flow diagram of the manufacturing method of the semiconductor device according to an embodiment of the present invention. Note that in an explanation given hereunder, an operation of each part constituting the MMT apparatus is controlled by the controller 121.

(2-1) Carry-in of the Silicon Substrate (S1)

First, the susceptor 217 is lowered to a transportation position of the silicon substrate 200, and the wafer push-up pins 266 are penetrated the through hole 217a of the susceptor 217. As a result, upper end portions of the push-up pins 266 are set in a state of being protruded a prescribed height from the surface of the susceptor 217.

Next, the gate valve 244 is opened, and by using the transportation unit not shown, the silicon substrate 200 is supported on the wafer push-up pins 266 protruded from the surface of the susceptor 217. Subsequently, the transportation unit is retreated to the outside of the processing chamber 201, the gate valve 244 is closed, and the processing chamber 201 is air-tightly closed.

Subsequently, the susceptor 217 is elevated by using the susceptor elevating/lowering unit 268. As a result, the silicon substrate 200 is disposed on the upper surface of the susceptor 217. Thereafter, the silicon substrate 200 is elevated to its processing position.

Note that in the manufacturing method of the semiconductor device according to an embodiment of the present invention, the resist is applied on the surface of the silicon substrate 200. The timing of applying the resist may be set either before or after carrying the silicon substrate 200 into the processing chamber 201.

(2-2) Heating of the Silicon Substrate (S2)

Subsequently, power is supplied to the heater embedded in the susceptor, and heating of the silicon substrate 200 is performed. A heating temperature at this time is set at a temperature not deteriorating the resist applied on the surface of the silicon substrate 200 by heat. Note that the deterioration of the resist here refers to hardening of the resist, for example. Specifically, the heating temperature is different depending on the kind of the resist applied on the surface of the silicon substrate 200. However, the heating temperature is preferably set to 90° C. or less.

(2-3) Introduction of $PH_3$ Content Gas (S3)

Subsequently, the $PH_3$ content gas is introduced to the inside of the processing chamber 201 from the gas implanting port 234a in a form of shower. A flow rate of the $PH_3$ content gas at this time is in a range from 1 to 1000 sccm. After introduction of the $PH_3$ content gas, by using the vacuum pump 246 and the APC 242, the pressure in the processing chamber 201 is adjusted to be in a range from 0.1 to 266 Pa.

(2-4) Plasmatization of the $PH_3$ Content Gas (S4)

After introducing the $PH_3$ content gas, the high frequency power is applied to the cylindrical electrode 215 via the matching unit 272 from the high frequency power supply 273 (the electrical field is formed in the processing chamber 201), and the magnetic field is formed in the processing chamber 201 by using the upper magnet 216a and the lower magnet 216b, thereby generating magnetron discharge in the processing chamber 201. Then, the high density plasma is generated in a plasma generation region in an upper part of the silicon substrate 200. Note that the power applied to the cylindrical electrode 215 is set in a range from about 100 to 500 W. In addition, an impedance value of the impedance variable unit 274 is previously controlled to a desired value.

(2-5) Formation of a Phosphorus Atom Diffusion Layer (S5)

As described above, by generating plasma, $PH_3$ gas molecules in the processing chamber 201 are decomposed. Then, P+ or p* is generated, which is then implanted to the surface of the silicon substrate 200, and a phosphorus atom diffusion layer is thereby formed. The depth or dose of the phosphorus atoms implanted to the surface of the silicon substrate 200 is defined by power of plasma, a bias voltage, a $PH_3$ flow rate, and a processing time. Therefore, by adjusting them, a desired implantation depth and dose can be obtained.

(2-6) Exhaustion of Residual Gas (S6)

When the formation of the phosphorus atom diffusion layer is ended, power supply to the cylindrical electrode 215 and supply of the $PH_3$ content gas to the inside of the processing chamber 201 are respectively stopped. Then, by using the gas exhaust pipe 231, residual gas in the processing chamber 201 is exhausted.

(2-7) Introduction of the $O_2$ Gas (S7)

After exhaustion of the inside of the processing chamber 201 is completed, the $O_2$ gas is introduced in the form of shower to the inside of the processing chamber 201 from the gas implanting port 234a. The flow rate of the $O_2$ gas at this time is in a range from 1 to 1000 sccm. After introduction of the $O_2$ gas, by using the vacuum pump 246 and the APC 242, the pressure in the processing chamber 201 is adjusted to be in a range from 0.1 to 266 Pa. Note that in the embodiment of the present invention, not only the $O_2$ gas but also inert gas such as Ar and He or mixed gas of the $O_2$ gas and the inert gas can also be used.

(2-8) Plasmatization of the $O_2$ Gas

The high frequency power is applied to the cylindrical electrode 215 from the high frequency power supply 273 via the matching unit 272 (the electric field is formed in the processing chamber 201) and the magnetic field is formed in the processing chamber 201 by using the upper magnet 216a and the lower magnet 216b, thereby generating the magnetron discharge in the processing chamber 201. Then, the high density plasma is generated in a plasma generation region in the upper part of the silicon substrate 200. Note that the power applied to the cylindrical electrode 215 is set in a range from about 100 to 500 W. The impedance value of the impedance variable unit 274 is previously controlled to a desired value.

(2-9) Formation of the Oxide Film (S9)

Figure 5:
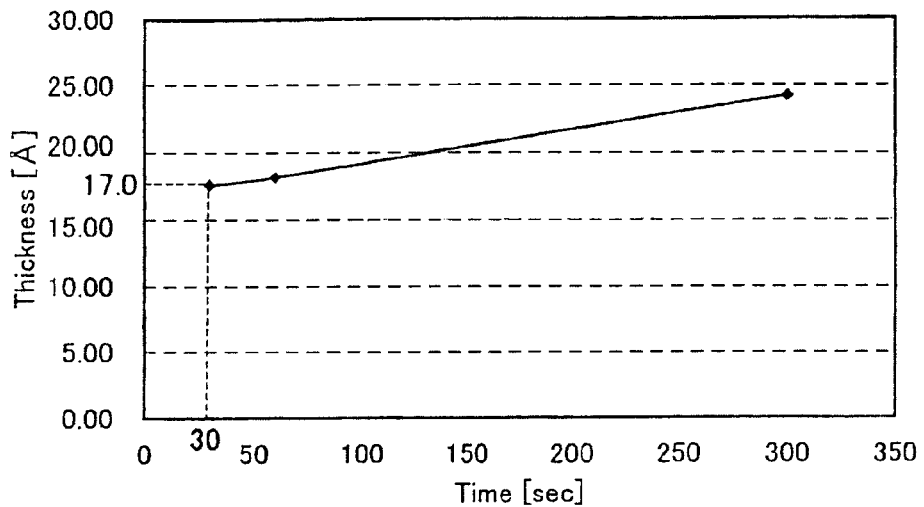
FIG. 5 is a graph showing a relation between a film thickness of an oxide film (cap film) and an oxide film formation time.
Figure 6:
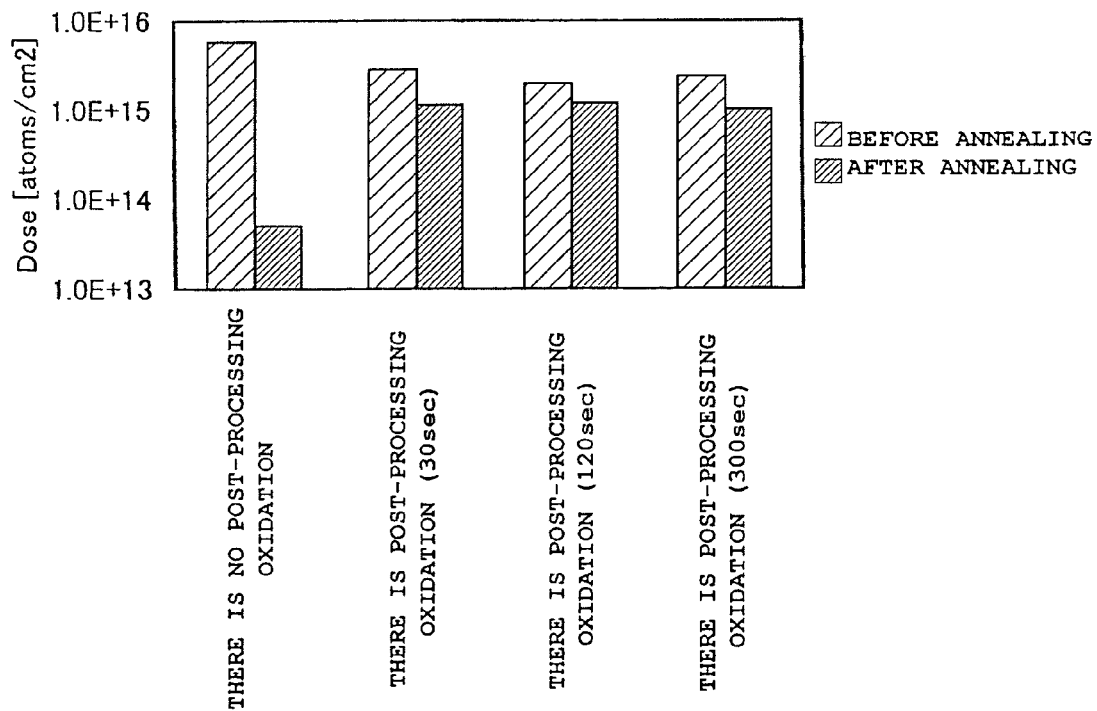
FIG. 6 is a graph showing the relation between the oxide film formation time and an amount of desorption of phosphorus atoms.

As described above, by generating plasma, the $O_2$ gas molecules in the processing chamber are decomposed. Then, O+ or O* is generated, to thereby oxidize the surface of the silicon substrate 200 and form the oxide film (cap film) thereon. An amount of oxidation (film thickness of the oxide film) of the silicon substrate 200 is defined by the power of plasma, bias voltage, oxygen flow rate, and processing time. Therefore, by adjusting them, a desired amount of oxidation (the film thickness of the oxide film) can be obtained. FIG. 5 is a graph showing a relation between the film thickness of the oxide film (cap film) and an oxide film formation time. Also, FIG. 6 is a graph showing a relation between the oxide film formation time and an amount of desorption of the phosphorus atoms. As is clarified from FIG. 5, when oxidation processing of 30 seconds is executed, the film thickness of 17 Å can be formed, and when the oxidation processing of 300 seconds is performed, the film thickness of about 24 Å can be formed. Also, as is clarified from FIG. 6, by setting the film thickness at 17 Å or more (by executing the oxidation processing of 30 seconds or more), it is possible to suppress the amount of desorption of the phosphorus atoms when the silicon substrate 200 is annealed.

(2-10) Carrying Out of the Silicon Substrate (S10)

After the oxidation processing of the silicon substrate 200 is completed, the power supply to the cylindrical electrode 215 and the supply of the $O_2$ gas to the inside of the processing chamber 201 are respectively stopped. Then, the susceptor 217 is lowered to the transportation position of the silicon substrate 200, and the silicon substrate 200 is supported on the wafer push-up pins 266 protruded from the surface of the susceptor 217. Finally, the gate valve 244 is opened, and by using the transportation unit not shown, the silicon substrate 200 is carried out to the outside of the processing chamber 201, to complete the manufacture of the semiconductor device according to the embodiment of the present invention.

(3) An advantage in the Embodiment of the Present Invention

According to the manufacturing method of the semiconductor device of the embodiment of the present invention, advantages of any one of the following (a) to (e) or more of them can be exhibited.

(a) The phosphorus atoms diffused in the silicon substrate are desorped in proportion to an elapsed time after diffusion. Meanwhile, according to the embodiment of the present invention, after the phosphorus atoms are diffused on the surface of the silicon substrate 200, the oxide film is formed on this diffusion layer. Thus, it becomes possible to prevent the diffused phosphorus atoms from being desorped from the silicon substrate 200.

Figure 3:
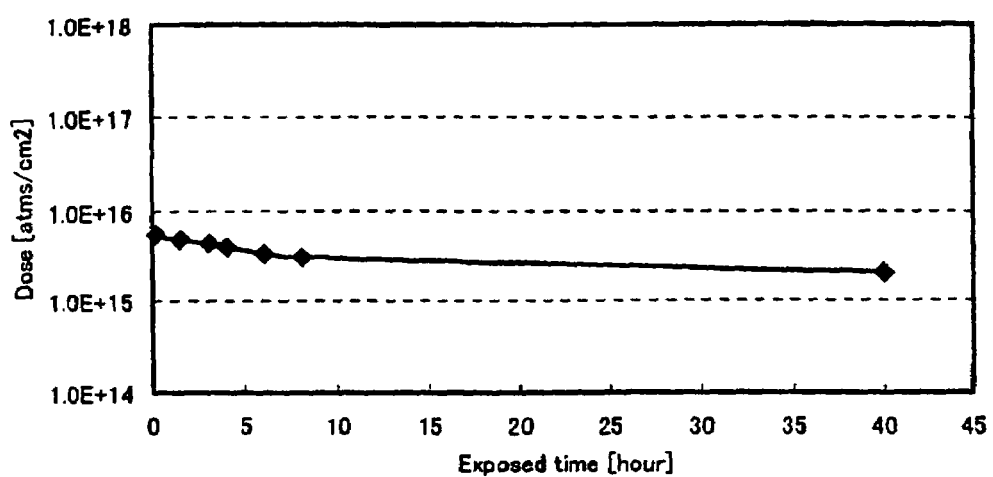
FIG. 3 is a graph showing an elapsed change of a dose to a silicon substrate according to an embodiment of the present invention.
Figure 4:
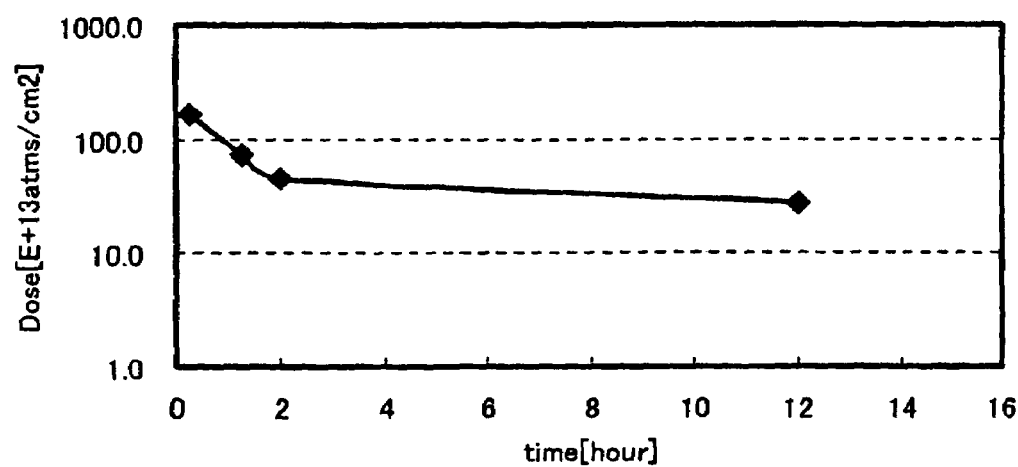
FIG. 4 is a graph showing an elapsed change of the dose to the silicon substrate according to a conventional art.

FIG. 3 is a graph showing the elapsed change of the dose to the silicon substrate according to the embodiment of the present invention. Meanwhile, FIG. 4 is a graph showing the elapsed change of the dose to the silicon substrate of the conventional art, namely, when the oxide film is not formed. This graph reveals that when the oxide film is not formed on the diffusion layer (FIG. 4), the dose is extremely reduced at 2 hours after forming the diffusion layer (namely, the amount of desorption of the phosphorus atoms is increased). Meanwhile, when the oxide film is formed on the diffusion layer by using an embodiment of the present invention (FIG. 3), it is found that the reduction of the dose can be suppressed.

(b) Along with the high integration of the semiconductor device, the three-dimensional construction of the device structure is progressed, and for example, the channel also needs to be three-dimensionally constructed. At this time, the ions need to be implanted not only from the vertical direction but also from the lateral direction. However, the conventional ion injection method has strong anisotropy and is disadvantageous for injecting the ions uniform both vertically and laterally. Meanwhile, according to an embodiment of the present invention, the plasma is used for forming the diffusion layer. Therefore, the phosphorus atoms can be diffused uniform both vertically and laterally.

(c) Along with the high integration of the semiconductor device, the channel, etc, being an object of diffusing the phosphorus atoms, tend to become thinner. However, when the ions are injected to such a thin channel by using the conventional ion injection method, the phosphorus atoms penetrate the channel in some cases. Meanwhile, according to the embodiment of the present invention, the plasma is used for forming the diffusion layer. Therefore, the phosphorus atoms can be thinly diffused on the channel, etc, thus making it possible to prevent the phosphorus atoms from penetrating the channel, etc.

(d) In forming the diffusion layer, when the silicon substrate 200 is heated, with the resist applied on the surface of the silicon substrate 200, deterioration such as hardening of the resist occurs, thus adversely affecting the processing step that follows thereafter in some cases. Meanwhile, according to an embodiment of the present invention, the silicon substrate 200 is heated to a temperature (for example 90° C. or less) not deteriorating the resist applied on the surface of the silicon substrate 200, to form the diffusion layer of the phosphorus atoms. In addition, in forming the diffusion layer, the plasma is used so that diffusion processing can be performed even when the surface temperature of the silicon substrate 200 is low. Accordingly, the diffusion layer can be formed, with the surface temperature of the silicon substrate 200 maintained lower than the temperature deteriorating the resist, thus making it possible to prevent the deterioration of the resist by heat.

(e) In forming the oxide film, when the silicon substrate 200 is heated, with the resist applied on the surface of the silicon substrate 200, the deterioration such as hardening of the resist occurs, thus adversely affecting the processing step that follows thereafter in some cases. Meanwhile, according to an embodiment of the present invention, in forming the oxide film, the plasma is used so that diffusion processing can be performed even when the surface temperature of the silicon substrate 200 is low. Accordingly, the diffusion layer can be formed, with the surface temperature of the silicon substrate 200 maintained lower than the temperature deteriorating the resist, thus making it possible to prevent the deterioration of the resist by heat.

Preferred aspects of the present invention will be additionally described hereunder.

A first aspect provides a manufacturing method of a semiconductor device that forms a diffusion layer by diffusing phosphorus atoms on the surface of a silicon substrate on which resist is applied, including:

a diffusion layer forming step of forming the diffusion layer, with a temperature of the silicon substrate maintained lower than a deterioration temperature of the resist; and an oxide film forming step of forming an oxide film by supplying plasma excitation gas to the surface of the formed diffusion layer.

According to the first aspect, after diffusing the phosphorus atoms on the surface of the silicon substrate, the oxide film is formed on this diffusion layer. Thus, desorption of the diffused phosphorus atoms from the silicon substrate can be prevented. In addition, the oxide film formed by the first aspect has a higher advantage of preventing the desorption of the phosphorus atoms than the oxide film formed by natural oxidation. Further, according to the first aspect, the silicon substrate is heated to the temperature not deteriorating the resist applied on the surface of the silicon substrate, and the diffusion layer of the phosphorus atoms is formed. Accordingly, it is possible to obviate a situation such as hardening of the resist on the silicon substrate, thereby adversely affecting the processing step thereafter. Moreover, according to the first aspect, plasma is used for forming the oxide film. Thus, the oxide film can be formed without increasing the surface temperature of the silicon substrate. Namely, in forming the oxide film, it is possible to obviate the situation such as hardening of the resist on the substrate, thereby adversely affecting the processing step thereafter.

A second aspect provides the manufacturing method of the semiconductor device according to the first aspect, wherein the diffusion layer forming step and the oxide film forming step are continuously performed in the same processing chamber.

According to the second aspect, after the diffusion layer is formed, the oxide film is formed continuously in the same processing chamber. Therefore, a period from the formation of the diffusion layer to the formation of the oxide film can be shortened, and the amount of desorption of the phosphorus atoms can be further suppressed. In addition, according to the second aspect, adhesion of particles onto the surface of the diffusion layer can be prevented by changing the processing chamber during a period from the formation of the diffusion layer to the formation of the oxide film. Further, according to the second aspect, the pressure, gas supply amount, temperature, etc, in the processing chamber can be continuously changed. Moreover, according to the second aspect, the diffusion layer forming step and the oxide film forming step are performed in the same processing chamber, thus making it possible to reduce a size of the semiconductor device manufacturing apparatus.

A third aspect provides the manufacturing method of the semiconductor device according to the first or second aspect, wherein in the diffusion layer forming step, the diffusion layer is formed by supplying plasma-excited phosphorus atoms content gas to the surface of the silicon substrate, with the temperature of the silicon substrate maintained lower than the deterioration temperature of the resist.

According to the third aspect, the plasma is used for forming the diffusion layer. Thus, the diffusion layer can be formed, with the surface temperature of the silicon substrate maintained lower than the deterioration temperature of the resist. Namely, in forming the oxide film, it is possible to obviate the situation such as hardening of the resist on the silicon substrate, thereby adversely affecting the processing step thereafter. In addition, according to the third aspect, the plasma is used for forming the diffusion layer, thus making it possible to diffuse the phosphorus atoms uniform both vertically and laterally. Accordingly, it is possible to respond to the manufacture of a device which is three-dimensionally constructed along with the high integration of the semiconductor device. Further, according to the third aspect, the plasma is used for forming the diffusion layer, and therefore the phosphorus atoms can be thinly diffused. Accordingly, it is possible to respond to a thin channel. Namely, even when the channel, etc, becomes thinner along with the high integration of the semiconductor device, the phosphorus atoms can be thinly diffused on the channel, etc, thus preventing the phosphorus atoms from penetrating the channel, etc.

A fourth aspect provides the manufacturing method of the semiconductor device according to the first aspect, wherein plasma excitation gas in the oxide film forming step includes gas obtained by plasma-exciting oxygen gas, gas obtained by plasma-exciting inert gas, or gas obtained by plasma-exciting mixed gas of the oxygen gas and the inert gas.

According to the fourth aspect, in forming the oxide film, the oxygen gas, the inert gas, or the mixed gas of the oxygen gas and the inert gas are plasma-excited and used, and therefore the diffusion layer can be formed without increasing the surface temperature of the silicon substrate. Namely, in forming the oxide film, it is possible to obviate the situation such as hardening of the resist on the silicon substrate, thereby adversely affecting the processing step thereafter. Also, the oxide film formed according to the fourth aspect has a higher advantage of preventing the desorption of the phosphorus atoms than the oxide film by natural oxidation.

A fifth aspect provides the manufacturing method of the semiconductor device according to the first aspect, wherein the thickness of the oxide film formed in the oxide film forming step is 17 Å or more.

A sixth aspect provides the manufacturing method of the semiconductor device for forming the diffusion layer by diffusing the phosphorus atoms on the surface of the silicon substrate on which the resist is applied, including:

a diffusion layer forming step of forming the diffusion layer, with the temperature of the silicon substrate maintained lower than the deterioration temperature of the resist.

According to the sixth aspect, the silicon substrate is heated to the temperature not deteriorating the resist applied on the surface of the silicon substrate, to form the diffusion layer of the phosphorus atoms. Accordingly, it is possible to obviate the situation such as hardening of the resist on the silicon substrate, thereby adversely affecting the processing step thereafter.

A seventh aspect provides the manufacturing method of the semiconductor device according to the sixth aspect, wherein the temperature of the silicon substrate in the diffusion layer forming step is maintained to 90° C. or less. According to the seventh aspect, by heating the silicon substrate to 90° C. or less, the deterioration of the resist on the silicon substrate can be prevented.

Other Embodiment

The above-described embodiments show a method of diffusing the phosphorus atoms on the channel of FET. However, the present invention is not limited to the channel, and can be applied to a case of diffusing the phosphorus atoms over the source and drain, for example.

Figure 7:
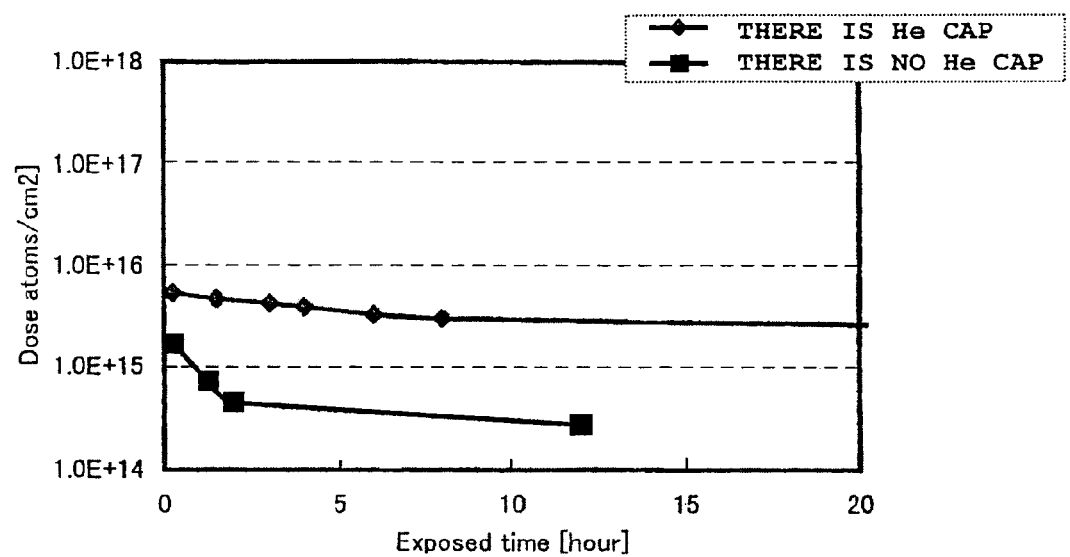
FIG. 7 is a graph showing an elapsed change of the dose to the silicon substrate, when helium is introduced instead of oxygen (when there is a He cap) and when the helium is not introduced (when there is no He cap).

In addition, as shown in FIG. 7, after forming the phosphorus atom diffusion layer (S5), even if helium is introduced instead of introducing oxygen, the amount of desorption of the phosphorus atoms can be suppressed. FIG. 7 is a graph showing an elapsed change of the dose to the silicon substrate, when the helium is introduced instead of introducing the oxygen (there is He cap), and when the helium is not introduced (there is no cap). Also, when nitrogen is introduced instead of introducing the oxygen or helium, the desorption of the phosphorus atoms can be prevented. However, when the cap by nitrogen is formed, the time required for removing a nitride film is prolonged compared to the time required for removing the oxide film in the step of removing the cap thereafter. Therefore, it appears that there is also a case that the throughput of the manufacturing method of the semiconductor device is more deteriorated than a case of introducing the oxygen or helium.

Figure 8:
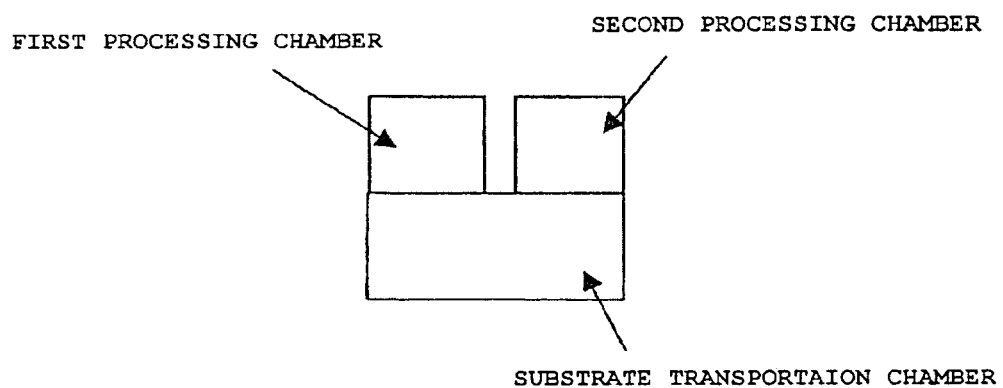
FIG. 8 is a schematic view showing a constitutional example of a semiconductor device manufacturing apparatus of a cluster type.

Further, although the second aspect provides the aspect of performing diffusion and oxidation of the phosphorus atoms in the same processing chamber, each processing may be performed in a separate processing vessel. In this case, for example, a processing system of cluster type shown in FIG. 8 can be used. After doping the phosphorus atoms in the first processing chamber, the substrate transportation chamber is evacuated, then an already processed substrate is transported to the substrate processing chamber, and subsequently the substrate after processing is carried into the second processing chamber, which is then subjected to oxidation processing. However, unlike the processing in the same processing chamber, a certain period of time is required from diffusion processing of the phosphorus atoms to plasma-oxidation processing. Therefore, it appears that there is also a case that the amount of desorption of the phosphorus atoms is more increased as a result than a case of processing in the same processing chamber.

What is claimed is:

1. A manufacturing method of a semiconductor device for forming a diffusion layer by diffusing phosphorus atoms on a surface of a silicon substrate on which resist is applied, including:
   a diffusion layer forming step of forming said diffusion layer, with a temperature of said silicon substrate having said resist maintained lower than a deterioration temperature of said resist, and
   an oxide film forming step of forming an oxide film by supplying plasma excitation gas to the surface of said formed diffusion layer with a temperature of said silicon substrate having said resist maintained lower than said deterioration temperature of said resist.

2. The manufacturing method of the semiconductor device according to claim 1, wherein in said diffusion layer forming step, said diffusion layer is formed by supplying plasma-excited phosphorus atom content gas to the surface of the silicon substrate, with the temperature of said silicon substrate having said resist maintained lower than said deterioration temperature of said resist.

3. The manufacturing method of the semiconductor device according to claim 1, wherein the temperature of said silicon substrate having said resist in said diffusion layer forming step is maintained to 90° C. or less.

4. The manufacturing method of the semiconductor device according to claim 2, wherein the temperature of said silicon substrate having said resist in said diffusion layer forming step is maintained to 90° C. or less.

5. The manufacturing method of the semiconductor device according to claim 2, wherein the plasma excitation gas in said oxide film forming step is gas obtained by plasma-exciting oxygen gas, gas obtained by plasma-exciting inert gas, or gas obtained by plasma-exciting mixed gas of the oxygen gas and the inert gas.

6. The manufacturing method of the semiconductor device according to claim 2, wherein a thickness of the oxide film formed by said oxide film forming step is 17 Å or more.

7. The manufacturing method of the semiconductor device according to claim 2, wherein said diffusion layer forming step and said oxide film forming step are performed continuously in the same processing chamber.

* * * * *